United States Patent
Okazaki et al.

(10) Patent No.: US 7,190,222 B2
(45) Date of Patent: Mar. 13, 2007

(54) PREDISTORTER

(75) Inventors: Takashi Okazaki, Tokyo (JP); Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 40 days.

(21) Appl. No.: 11/042,521

(22) Filed: Jan. 26, 2005

(65) Prior Publication Data

US 2005/0195030 A1    Sep. 8, 2005

(30) Foreign Application Priority Data

Jan. 29, 2004  (JP) .............................. 2004-020801

(51) Int. Cl.
 *H03F 1/26* (2006.01)
(52) U.S. Cl. ..................................... 330/149
(58) Field of Classification Search ............... 330/149; 455/114.3
See application file for complete search history.

(56) References Cited

U.S. PATENT DOCUMENTS

| | | | | |
|---|---|---|---|---|
| 5,589,797 A | * | 12/1996 | Gans et al. | 330/149 |
| 6,388,518 B1 | * | 5/2002 | Miyatani | 330/149 |
| 7,023,273 B2 | * | 4/2006 | Johnson et al. | 330/149 |
| 2004/0239429 A1 | * | 12/2004 | Kermalli | 330/280 |

* cited by examiner

*Primary Examiner*—Robert Pascal
*Assistant Examiner*—Hieu Nguyen
(74) *Attorney, Agent, or Firm*—Wenderoth, Lind & Ponack, L.L.P.

(57) ABSTRACT

A predistortion distortion signal generating unit uses a signal to be amplified to generate a predistortion distortion signal including odd-order signal components of the signal. A delay time difference adjusting unit adjusts a delay time difference between a signal to be amplified and a distortion signal for predistortion such that an influence by the memory effect occurring in the amplifier can be reduced. A predistortion distortion signal giving unit gives a predistortion distortion signal to a signal to be amplified in a form that the delay time difference is adjusted.

5 Claims, 7 Drawing Sheets

PREDISTORTER

BACKGROUND OF THE INVENTION

1. Field of the Invention

The present invention relates to a predistorter used in a distortion-compensated amplifier using predistortion technique for compensating for, by a predistortion technique, a distortion caused in an amplifier when an input signal is amplified by the amplifier, and, more specifically, it relates to a predistorter compensating for a nonlinear distortion due to a memory effect caused in an amplifier.

2. Description of the Related Art

For example, in a base station apparatus provided in a mobile communication system adopting Wide-band Code Division Multiple Access (W-CDMA) as a mobile communication technique, radio signals must be transmitted to a physically remote base station apparatus. Therefore, the signals must be largely amplified by an amplifier. However, since an amplifier is an analog device, the input/output characteristic is a nonlinear function. Especially, after the amplification limit called saturation point, the amount of power to be input to the amplifier increases, and substantially constant power is output. The nonlinear output causes nonlinear distortion. Though the signal component in an undesired signal band of a signal sent before amplification can be kept at a low level by a band limiting filter, nonlinear distortion occurs in the signal having passed through the amplifier. Thus, the signal component leaks to the undesired signal band (adjacent channel). For example, since transmission power is high in a base station apparatus as described above, the magnitude of the power leaking to such an adjacent channel is strictly defined. Therefore, a big issue here is how the power leak to an adjacent channel is reduced.

Accordingly, the predistortion technique has been proposed as one of distortion compensation techniques and is going mainstream instead of the feed forward technique because an amplification coefficient has been emphasized recently. The predistortion technique can compensate for distortion of signals output from an amplifier by giving in advance inverse characteristics of the AM-AM conversion and AM-PM conversion, which are nonlinearity of the amplifier, to signals input to the amplifier.

Figure 13:
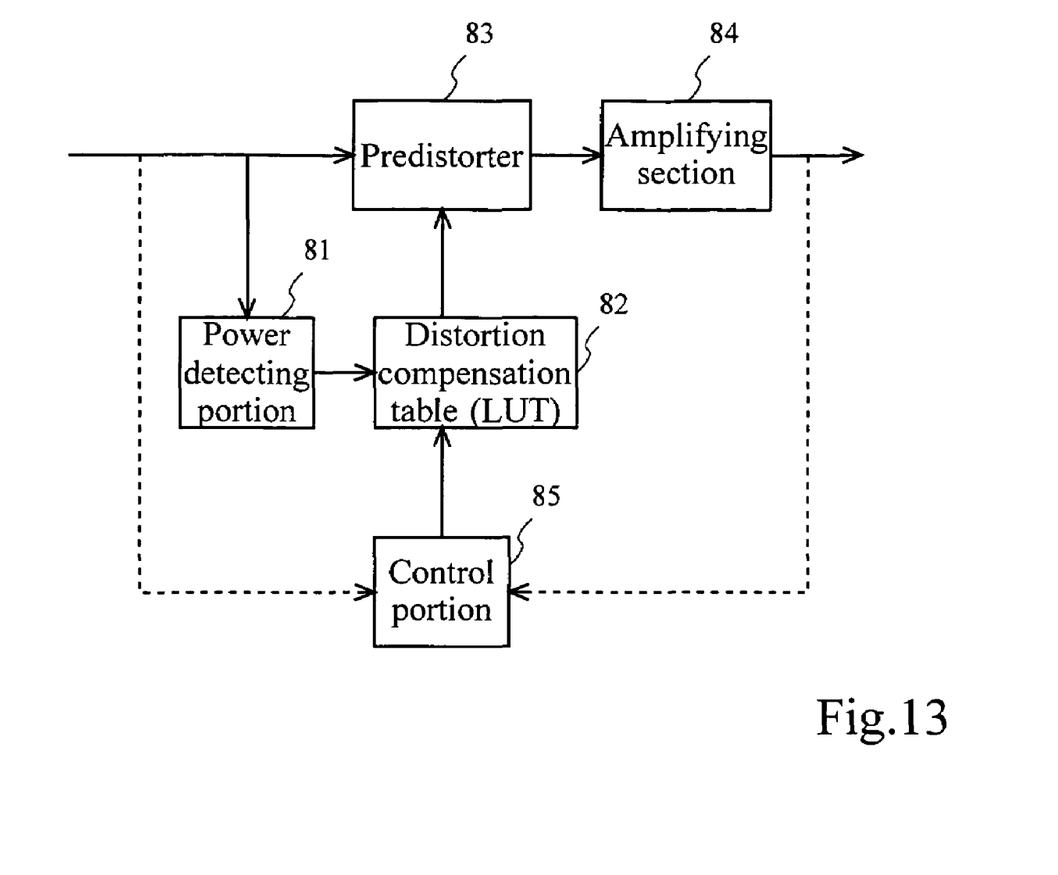
FIG. 13 is a diagram showing a construction example of a distortion-compensated amplifier using predistortion technique.

FIG. 13 shows a construction example of an amplifier compensating for a distortion by a predistortion technique (distortion-compensated amplifier using predistortion technique).

A distortion-compensated amplifier using predistortion technique in this example includes a power detecting portion 81, a distortion compensation table 82, a predistorter 83, an amplifying section 84 and a control portion 85.

An example of an operation to be performed by a distortion-compensated amplifier using predistortion technique in this example will be described.

Once a signal is input to the power detecting portion 81, predistorter 83 and control portion 85, the power detecting portion 81 detects the power or amplitude value of the input signal. Then, the power or amplitude value of the input signal is associated as a reference argument of a distortion compensation table 82 acting as a Look Up Table (LUT), using a memory, for example. The distortion compensation table 82 stores a table value for performing distortion compensation by predistortion technique in accordance with the power or amplitude value of a given signal. The distortion compensating table 82 ideally defines an inverse characteristic of nonlinearity of an amplifier (amplifying section 84 in this example) to be distortion-compensated and generally defines a value relating to AM-AM conversion (amplitude) and value relating to AM-PM conversion (phase) using the power or amplitude of the input signal as an index.

The predistorter 83 controls the amplitude and phase of the input signal in accordance with a result of the reference to the distortion compensation table 82. The signal distorted by the predistortion technique in advance is amplified by the amplifying section 84, and an amplified signal without distortion is output from the amplifying section 84.

In order to adapt to an environment such as a temperature variation, the control portion 85 updates details on the distortion compensation table 82 based on the input signal and amplified input signal.

However, in a distortion causing mechanism in an amplifier, the current state may depend on not only an AM-AM characteristic and AM-PM characteristic relating to instant power but also a past state such as the memory effect. Thus, in the construction including the distortion compensating table 82 referred by instant power as an only index, the nonlinear distortion caused by the memory effect cannot be compensated.

Various studies have been made for such a memory effect (refer to JP-A-11-191716 and "Gusuji Hizumi no Eikyo wo Ukeru Zofukuki ni Taisuru Tekiou Predistorter-Gata Hizumi Hosho (Adaptive Predistorter Type Distortion Compensation For Amplifier Influenced by Even Order Distortion)", Kawaguchi and Akaiwa, Shingakugiho, MW2002-208 (2003-03), p. 63–66), but further developments for suppressing influences due to a memory effect are still being demanded.

SUMMARY OF THE INVENTION

The invention was made in view of these conventional matters, and it is an object of the invention to provide a predistorter, which can compensate for a nonlinear distortion due to a memory effect caused in a distortion-compensated amplifier using predistortion, for example, in amplifying a signal input from the amplifier and compensating a distortion caused in the amplifier by a predistortion technique.

In order to achieve the object, a predistorter according to one aspect of the invention performs following processing. In this case, in a distortion-compensated amplifier using predistortion technique, a predistorter is provided before the amplifier. Furthermore, in a distortion-compensated amplifier using predistortion technique, distortion compensation is performed by the predistorter provided before the amplifier by compensating for distortion occurring in the amplifier in amplifying a signal to be amplified by the amplifier by using a predistortion technique.

In other words, in the predistorter, a predistortion distortion signal generating unit uses a signal to be amplified to generate a predistortion distortion signal including odd-order signal components of the signal. Furthermore, a delay time difference adjusting unit adjusts a delay time difference between a signal to be amplified and a distortion signal for predistortion generated by the predistortion distortion signal generating unit such that an influence by the memory effect occurring in the amplifier can be reduced. Then, a predistortion distortion signal giving unit gives a predistortion distortion signal generated by the predistortion distortion signal generating unit to a signal to be amplified in a form that the delay time difference is adjusted by the delay time difference adjusting unit.

Therefore, when a distortion is compensated by a predistortion technique by adjusting a delay time difference between a signal to be amplified and a predistortion distortion signal such that an influence by the memory effect occurring in the amplifier can be reduced, the distortion due to the AM-AM characteristic and/or AM-PM characteristic can be compensated, and a distortion caused by an influence due to the memory effect of the amplifier can be compensated better than conventional cases, for example.

Here, various signals may be used as signals to be amplified. For example, when the predistorter is applied in a transmitter amplifier of a transmitter, a signal to be transmitted is used as a signal to be amplified.

Furthermore, the predistorter may be provided before the amplifier to be distortion-compensated in various arrangements. For example, the predistorter may be provided immediately before the amplifier. Alternatively, a different circuit may be provided between the amplifier and the predistorter.

Various signals may be used as predistortion distortion signals including odd-order signal components of a signal to be amplified. For example, a signal including signal components of the odd orders equal to or higher than the third order may be used. For example, a signal including a third-order signal component (with third power term), fifth order signal component (with fifth power term), seventh order (seventh power) signal component, . . . and (2N+1)th order signal component (with (2N+1)th power term) of a signal to be amplified may be used where N is an arbitrary integer equal to or larger than 1.

Various forms may be adopted as the form of adjusting a delay time difference. For example, a form may be used in which a distortion due to an AM-AM-characteristic and/or AM-PM characteristic of an amplifier and a distortion due to the memory effect of the amplifier can be compensated.

As a way of adjusting a delay time difference, a way may be used in which an adjustment value, which is defined fixedly, is used to adjust a delay time difference. Alternatively, a way may be used in which, based on a signal amplified by the amplifier, an adjustment value, which can be defined adjustably, is used to adjust a delay time difference such that a distortion included in a distortion-compensated and amplified signal can be small.

As the form of adjusting a delay time difference between two signals, a form may be adopted in which the timing of one of the signals is only adjusted. Alternatively, a form may be adopted in which the timing of both of the signals is adjusted.

As the form of giving a predistortion distortion signal to a signal to be amplified, a form may be adopted in which a predistortion distortion signal is added to or subtracted from a signal to be amplified.

A predistorter according to another aspect of the invention performs following processing. In this case, in a distortion-compensated amplifier using predistortion technique, a predistorter is provided before the amplifier. Furthermore, in a distortion-compensated amplifier using predistortion technique, distortion compensation is performed by the predistorter provided before the amplifier by compensating for distortion occurring in the amplifier in amplifying a signal to be amplified by the amplifier by using a predistortion technique.

In other words, in the predistorter, a predistortion control signal outputting unit outputs a predistortion control signal based on a level of a signal to be amplified. Furthermore, a delay time difference adjusting unit adjusts a delay time difference between a signal to be amplified and a predistortion control signal output by the predistortion control signal outputting unit such that an influence by the memory effect occurring in the amplifier can be reduced. Then, a predistortion control signal computing unit computes a predistortion control signal output by the predistortion control signal outputting unit in a form that the delay time difference is adjusted by the delay time difference adjusting unit.

Therefore, when a distortion is compensated by a predistortion technique by adjusting a delay time difference between a signal to be amplified and a predistortion control signal such that an influence by the memory effect occurring in the amplifier can be reduced, the distortion due to the AM-AM characteristic and/or AM-PM characteristic can be compensated, and a distortion caused by an influence due to the memory effect of the amplifier can be compensated better than conventional cases, for example.

Here, various signals may be used as signals to be amplified. For example, when the predistorter is applied in a transmitter amplifier of a transmitter, a signal to be transmitted is used as a signal to be amplified.

Furthermore, the predistorter may be provided before the amplifier to be distortion-compensated in various arrangements. For example, the predistorter may be provided immediately before the amplifier. Alternatively, a different circuit may be provided between the amplifier and the predistorter.

As a level of a signal to be amplified, various levels may be used such as a level of amplitude or a level of power.

Furthermore, as a predistortion control signal, a value of a predistortion control signal corresponding to, for example, the value of a level of a signal to be amplified is provided, and the provided details may be stored in a table including a memory.

Various forms may be adopted as the form of adjusting a delay time difference. For example, a form may be used in which a distortion due to an AM-AM-characteristic and/or AM-PM characteristic of an amplifier and a distortion due to the memory effect of the amplifier can be compensated.

As a way of adjusting a delay time difference, a way may be used in which an adjustment value, which is defined fixedly, is used to adjust a delay time difference. Alternatively, a way may be used in which, based on a signal amplified by the amplifier, an adjustment value, which can be defined adjustably, is used to adjust a delay time difference such that a distortion included in a distortion-compensated and amplified signal can be small.

As the form of adjusting a delay time difference between two signals, a form may be adopted in which the timing of one of the signals is only adjusted. Alternatively, a form may be adopted in which the timing of both of the signals is adjusted.

Various forms may be adopted as a form of computing a predistortion control signal for a signal to be amplified such as a form in which a signal to be amplified is multiplied by a predistortion control signal. Here, when a complex signal containing an I component and a Q component is used as a signal, complex multiplication is performed as the multiplication.

A predistorter according to another aspect of the invention performs following processing. In this case, in a distortion-compensated amplifier using predistortion technique, a predistorter is provided before the amplifier. Furthermore, in a distortion-compensated amplifier using predistortion technique, distortion compensation is performed by the predistorter provided before the amplifier by compensating for distortion occurring in the amplifier in amplifying a signal to be amplified by the amplifier by using a predistortion technique.

In other words, in the predistorter, a predistortion distortion generation control signal outputting unit outputs a predistortion distortion generation control signal based on a level of a signal to be amplified. Furthermore, a delay time difference adjusting unit adjusts a delay time difference between a signal to be amplified and a predistortion distortion generation control signal output by the predistortion distortion control signal outputting unit such that an influence by the memory effect occurring in the amplifier can be reduced. Then, a predistortion distortion is generated which is controlled by a predistortion distortion generation control signal output by the predistortion distortion generation control signal outputting unit in a form that the delay time difference is adjusted by the delay time difference adjusting unit.

Therefore, when a distortion is compensated by predistortion technique by adjusting a delay time difference between a signal to be amplified and a predistortion distortion generation control signal such that an influence by the memory effect occurring in the amplifier can be reduced, the distortion due to the AM-AM characteristic and/or AM-PM characteristic can be compensated, and a distortion caused by an influence due to the memory effect of the amplifier can be compensated better than conventional cases, for example.

Here, various signals may be used as signals to be amplified. For example, when the predistorter is applied in a transmitter amplifier of a transmitter, a signal to be transmitted is used as a signal to be amplified.

Furthermore, the predistorter may be provided before the amplifier to be distortion-compensated in various arrangements. For example, the predistorter may be provided immediately before the amplifier. Alternatively, a different circuit may be provided between the amplifier and the predistorter.

As a level of a signal to be amplified, various levels may be used such as a level of amplitude or a level of power.

Furthermore, as a predistortion distortion generation control signal, a value of a predistortion control distortion generation signal corresponding to, for example, the value of a level of a signal to be amplified is provided, and the provided details may be stored in a table including a memory.

Various forms may be adopted as the form of adjusting a delay time difference. For example, a form may be used in which a distortion due to an AM-AM-characteristic and/or AM-PM characteristic of an amplifier and a distortion due to the memory effect of the amplifier can be compensated.

As a way of adjusting a delay time difference, a way may be used in which an adjustment value, which is defined fixedly, is used to adjust a delay time difference. Alternatively, a way may be used in which, based on a signal amplified by the amplifier, an adjustment value, which can be defined adjustably, is used to adjust a delay time difference such that a distortion included in a distortion-compensated and amplified signal can be small.

As the form of adjusting a delay time difference between two signals, a form may be adopted in which the timing of one of the signals is only adjusted. Alternatively, a form may be adopted in which the timing of both of the signals is adjusted.

Various forms may be adopted as a form of generating a predistortion distortion to be controlled by a predistortion distortion generation control signal for a signal to be amplified. For example, a form may be adopted in which an amplitude distortion and/or a phase distortion are generated. A predistortion distortion generation control signal may include, for example, a control signal for controlling generation of an amplitude distortion and a control signal for controlling generation of phase distortion.

As described above, since, in a predistorter according to the invention, predistortion is performed by adjusting a delay time difference between a signal to be amplified and a predetermined signal for performing the predistortion such that an influence by a memory effect occurring in the amplifier can be reduced, the distortion due to the AM-AM characteristic and/or AM-PM characteristic can be compensated, and a distortion caused by an influence due to the memory effect of the amplifier can be compensated well.

DESCRIPTION OF THE PREFERRED EMBODIMENTS

Embodiments according to the invention will be described with reference to the drawings.

In this embodiment, in order to compensate for a nonlinear distortion due to a memory effect caused in an amplifier, a delay unit is added to a predistorter (PD) so that an input to the amplifier can be delayed. Thus, a distortion can be compensated by an odd-order predistorter only.

First of all, a principle for compensating for a nonlinear distortion due to a memory effect caused in an amplifier in this embodiment will be described.

That is, the input/output characteristic of amplitude of an amplifier having a memory effect has a hysteresis characteristic (see JP-A-11-191716, for example). Thus, signals at a same input level can be output differently at rising edges and trailing edges. Therefore, a delay in waveform may exist between a time waveform of the input signal and a time waveform of the signal output from the amplifier (that is, one of them is advanced or delayed).

Figure 11:
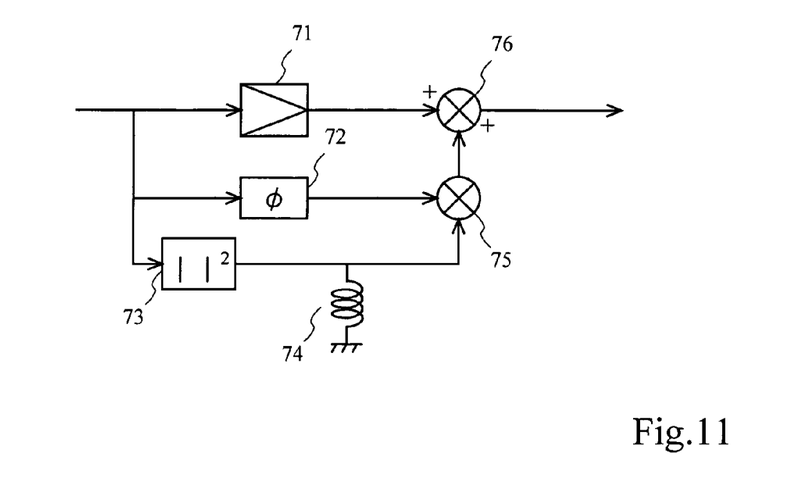
FIG. 11 is a diagram showing an example of a model of an amplifier considering a memory effect.

FIG. 11 shows an example model of an amplifier in consideration of an influence of the memory effect (refer to Kawaguchi and Akaiwa, for example). Distortion occurring in the model cannot be compensated by the inverse characteristics of an AM-AM characteristic and AM-PM characteristic, which is a principle of predistortion.

Since the entire construction shown in FIG. 11 is equivalent to an amplifier in this model, processing portions 71 to 76 are not always provided in the amplifier as they are.

The amplifier 71 functions as an amplifying section having an AM-AM characteristic and AM-PM characteristic only, that is, an amplifying section not considering the memory effect and refers to one in which distortion can be completely compensated by the predistortion principle.

Here, power supply voltage of an amplifier such as a power amplifier (PA) is desirably constant, but power supply voltage varies as described below. Thus, the memory effect occurs.

In other words, a distortion of the odd order generally occurs near a carrier as an intermodulation distortion IMD such as a third-order intermodulation distortion (IMD3) and fifth-order intermodulation distortion (IMD5).

On the other hand, a frequency spectrum having a non-linear component of the even order has a base band and the double or more frequency component of that of an input signal. Current having a distortion component of the even order occurring in the base band among them is fed to a drain bias circuit, and the current is converted to voltage signals by parasite inductance existing in a bias circuit and/or output matching circuit in a transistor (such as a Field Effective Transistor, that is, FET).

For example, when broadband signals are used as in W-CDMA system, a higher band has distortion of the even order. Thus, higher voltage has distortion of the even order, and a drain bias fluctuation is caused. Due to the drain bias fluctuation, a carrier signal is modulated again, and new distortion is caused near the carrier.

When an amplifier effected by intermodulation distortion is modeled, a so-called hysteresis characteristic is exhibited in which multiple output voltages and phases occur with respect to one input due to the memory effect of the inductor.

The fact will be described with reference to the model shown in FIG. 11.

A square law detector (square circuit) 73 detects a second order distortion component, which occurs in the base band, of a signal input to an amplifier 71 and is assumed as a current source in the model.

The inductance 74 corresponds to a parasite component included in a bias circuit and/or output matching circuit of the amplifier 71. For example, when a broadband signal is handled as in W-CDMA system, the band of the second order distortion component in the base band is increased, and the inductance 74 becomes high impedance. Thus, voltage is generated, and voltage of the bias circuit is changed.

In response to a constant phase change (having a fixed value thereof), an input signal is re-modulated by a fixed phase changer 72 with a voltage change in the bias circuit. The re-modulation is performed by a multiplier 75. A signal of a multiplication result by the multiplier 75 is added, as a memory effect component, to a signal output from a conventional amplifier model (amplifier 71) by the adder 76.

Thus, amplitude modulation of an input signal with a signal of voltage of the inductance 74 generates a new third-order distortion. Then, signals from two parts are synthesized by the adder 76, and an amplifier output signal including an influence of the memory effect is generated.

Here, a second order distortion component is only considered for describing the mechanism of memory effect occurrence. However, since, in general, a distortion component of the even order such as the fourth order and the sixth order occurs in the base band, a bias component also occurs similarly. In this case, the portion corresponding to the square law detector 73 may be replaced by the one of the even power such as the fourth power and the sixth power. Then, like the case of the second order, an output from the portion corresponding to the multiplier 75 is added to a signal output from the conventional amplifier model (amplifier 76). The memory effect cannot be compensated by a predistorter only using instant power as a reference argument.

As a result of a simulation using the amplifier model in FIG. 11, phases are output in which the time waveform is delayed between a waveform output from the amplifier model without the memory effect and a waveform output from the amplifier model with the memory effect.

Figure 12:
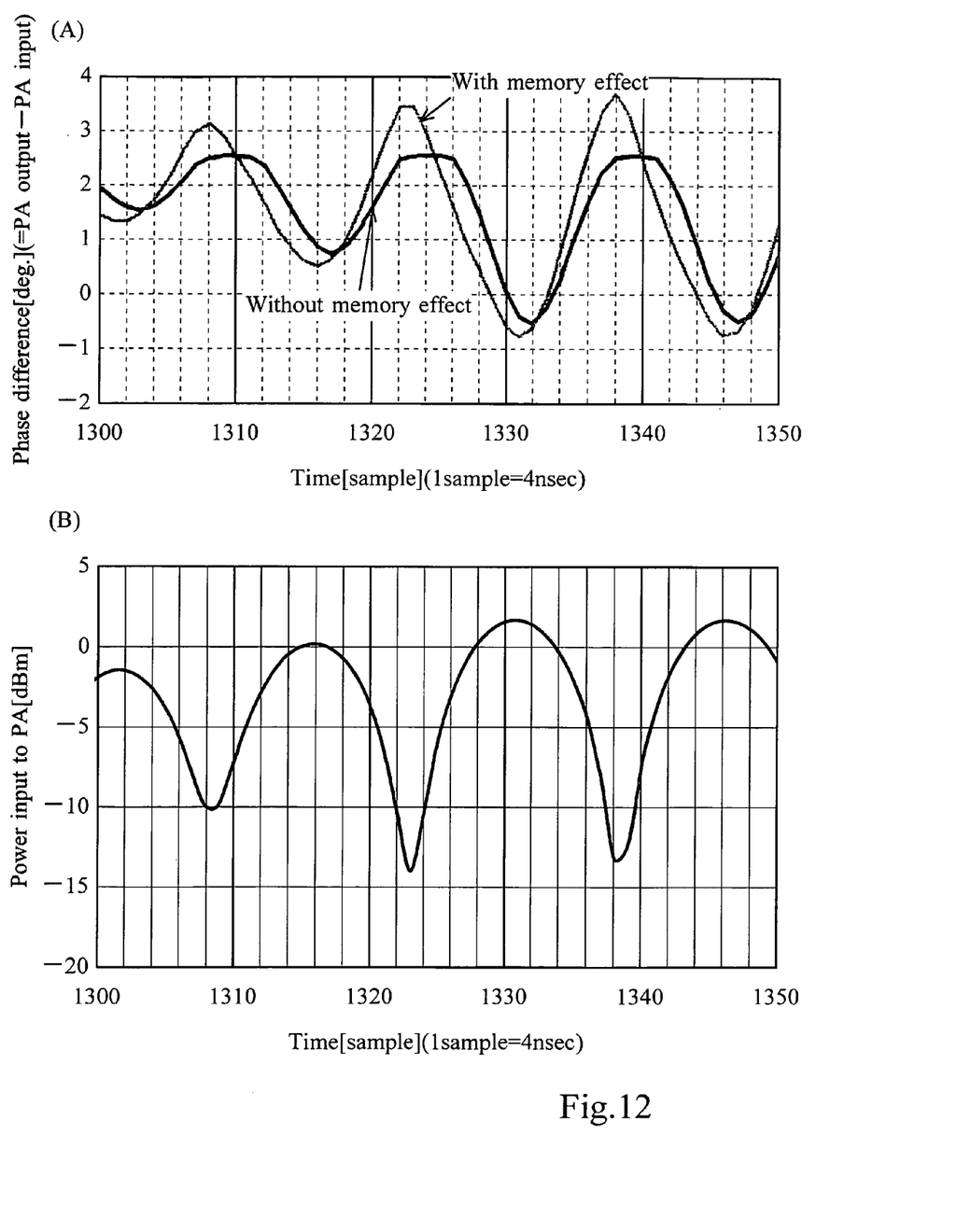
FIG. 12A is a diagram showing an example of time waveforms relating to a phase output from an amplifier.
FIG. 12B is a diagram showing an example of time waveforms relating to power input to the amplifier.

FIG. 12A shows examples of the time waveforms of the phases from the amplifiers where the horizontal axis refers to a time [sample] with {1 sample=4 nsec} and the vertical axis refers to a value of a phase difference (input/output phase difference) [deg] resulting from the subtraction of an input phase from an output phase of the amplifier. FIG. 12B shows an example of the time waveform of a power value input to the amplifier where the horizontal axis refers to a time [sample] with {1 sample=4 nsec} and the vertical axis refers to a power value [dBm] input to the amplifier. As shown in FIGS. 12A and 12B, the amplitude (power) of an input signal varies in this example. Furthermore, a power amplifier (PA) is used as the amplifier in this example.

Here, when the time waveform in the amplifier model with the memory effect is delayed (or advanced) by about one sample (about 4 [nsec]) between the time waveform in the phase in the amplifier model without the memory effect and the time waveform in the phase in the amplifier model with the memory effect, the correlation with the time waveform in the amplifier model without the memory effect is high. Based on the fact that a distortion in the amplifier without the memory effect can be sufficiently compensated by a predistorter using only instant power as a reference argument, the time may be delayed (or advanced) in advance for the signal output from the predistorter, for example, in the amplifier with the memory effect and may be input to the amplifier. Thus, the output from the amplifier is highly correlated to the waveform without the memory effect. Therefore, a distortion can be compensated only by the predistorter using only instant power as a reference argument, for example.

First Embodiment

A first example of the present invention will be described.

Figure 1:
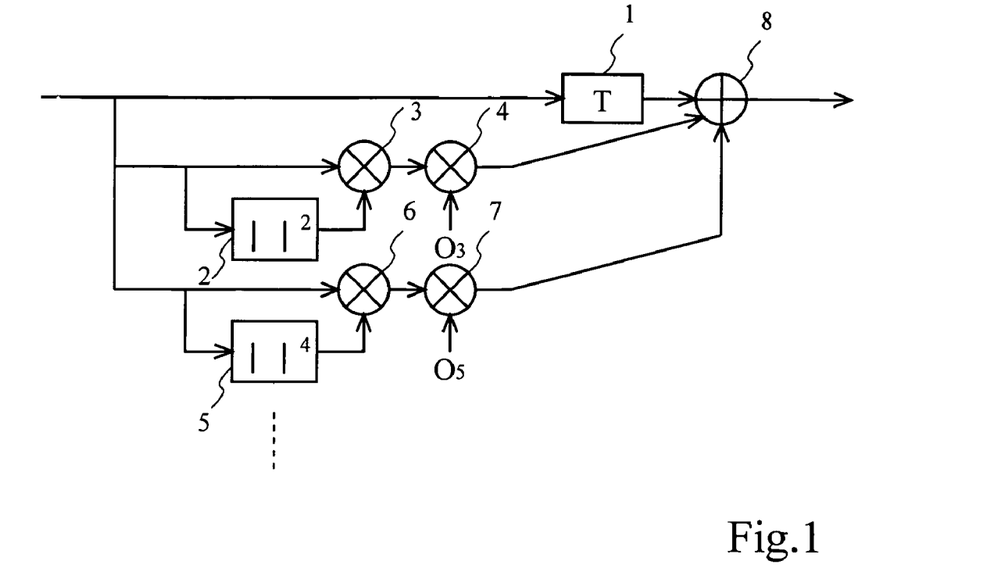
FIG. 1 is a diagram showing a construction example of a predistorter according to a first embodiment of the invention.

FIG. 1 shows one construction example of a predistorter of this embodiment.

As shown in FIG. 1, the predistorter in this embodiment includes a delay circuit 1, a square-law detector 2, a multiplier 3, a complex multiplier 4, a fourth power law detector 5, a multiplier 6, a complex multiplier 7 and an adder 8. While FIG. 1 shows a signal path having the square-law detector 2 and a signal path having the fourth power law detector 5, a signal path may further be provided in parallel including detectors, multipliers and complex multipliers of the even power such as sixth power, eighth power and tenth power.

An example of an operation to be performed by the predistorter in this example will be described.

Input signals are I, Q digital base band signals with complex vectors and are input to the delay circuit 1, square-law detector 2, multiplier 3, fourth power law detector 5 and multiplier 6.

The square-law detector 2 calculates a square value of an input signal and outputs the calculation result to the multiplier 3. The multiplier 3 multiplies a signal of the square value from the square-law detector 2 by the input signal and outputs the multiplication result to the complex multiplier 4. The multiplication result has the amplitude of the input signal raised to the third power, and the phase can be maintained therein. The complex multiplier 4 complex-multiplies the signal of the multiplication result by a distortion compensation coefficient O3 and outputs the complex-multiplication result to the adder 8.

Similarly, the fourth-power law detector 5 calculates the fourth power value of an input signal and outputs the calculation result to the multiplier 6. The multiplier 6 multiplies the fourth-power value from the fourth-power law detector 5 by the input signal and outputs the multiplication result to the complex multiplier 7. The multiplication result has the amplitude of the input raised to the fifth power, and the phase can be maintained therein. The complex multiplier 7 complex-multiplies the signal of the multiplication result by a distortion compensation coefficient O5 and outputs the complex-multiplication result to the adder 8.

The delay circuit 1 delays and outputs an input signal to the adder 8.

The adder 8 adds the signal input from the delay circuit 1 and signals input from the complex-multipliers 4 and 7 and outputs the addition result.

Furthermore, the operation example will be described in detail with reference to equations.

A distortion compensation coefficient Op (p=3, 5, 7 . . . ) is a complex vector (Opreal+J*Opimag) where j is an imaginary part. A distortion compensation coefficient Op can be defined such that a distortion can be compensated by a control portion.

The distortion compensation coefficient Op acting as a complex vector can be expressed by:

$$Op=|Amp|\exp(j*Phase)$$

$$|Amp|=sqrt\{(Opreal)^2+(Opimag)^2\}$$

$$Phase=\tan^{-1}\{(Opimag)/(Opreal)\} \quad [EQ1]$$

where |Amp| is an amplitude component and Phase is a phase component.

The delay circuit 1 delays and outputs an input signal by a predetermined time $\Delta t$, for example.

The adder 8 adds signals of the odd order (such as third order, fifth order and so on) input from the complex multipliers 4 and 7 to an input signal delayed by the delay circuit 1 by the time $\Delta t$ and gives and outputs the inverse characteristic of an AM-AM characteristic and AM-PM characteristic thereto.

Then, the signal Spd(t) output from the adder 8 can be expressed by:

$$Spd(t)=S(t-\Delta t)+O3*S'(t)^3+O5*S'(t)^5+\ldots$$

$$S'(t)^2=|S(t)|^{n-1}S(t)$$

$$(n=3,5,\ldots) \quad [EQ2]$$

where S(t) is a signal input to the predistorter and t is a time. This means that the input signal is delayed by $\Delta t$ for a predistorter control signal from each of the complex multipliers 4 and 7.

When the signal Spd(t) output from the adder 8 is input to the amplifier to be distortion-compensated, the signal cancels the influences of the AM-AM characteristic and AM-PM characteristic caused in the amplifier. Thus, the signal output from the amplifier no longer has the distortion, that is, the distortion can be compensated. The control portion defines an amount of delay $\Delta t$ by the delay circuit 1 based on, for example, a feedback signal output from the amplifier such that less distortion can remain after distortion compensation.

While, in EQ2, the examples with the third order and the fifth order were specifically illustrated, extension can also be performed on other odd orders such as seventh order and ninth order by replacing the square-law detector 2 and the fourth-power law detector 5 by a sixth-power law detector and an eighth-power law detector in general.

In the predistorter in this embodiment, a distortion compensation table such as a Look Up Table (LUT) including a memory, for example, is not required, which is an advantage.

Figure 2:
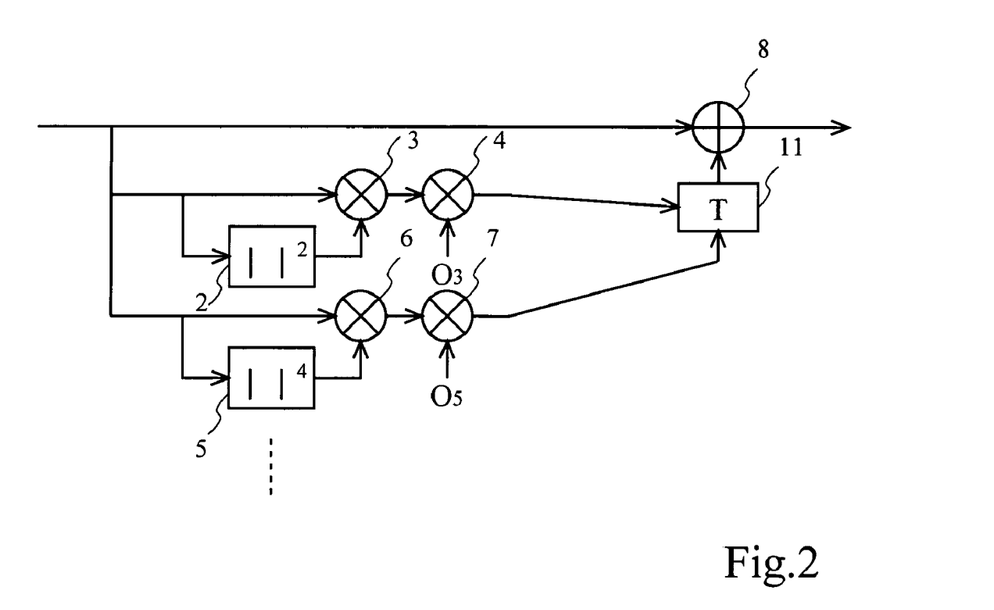
FIG. 2 is a diagram showing another construction example of the predistorter according to the first embodiment of the invention.

FIG. 2 shows another construction example of the predistorter of this example.

The construction of the predistorter shown in FIG. 2 differs from the construction of the predistorter shown in FIG. 1 in that, instead of the delay circuit 1 shown in FIG. 1, a delay circuit 11 having the same function as that of the delay circuit 1 shown in FIG. 1 is provided on the odd-order component input side of the adder 8. In this example, the same reference numerals are given to the same components as those shown in FIG. 1.

That is, both of the case in which the time waveform of the output from the amplifier is shifted in the direction of advancing in time and the case in which the time waveform is shifted in the direction of delaying in time may be considered as influences due to the memory effect. Therefore, the construction shown in FIG. 1 and the construction shown in FIG. 2 address the two respective cases.

More specifically, in the predistorter shown in FIG. 2, a signal input to the predistorter is input to the adder 8 without delay, and signals output from the complex multipliers 4 and 7 are delayed by the delay circuit 11 by a predetermined time $\Delta t$ and are input to the adder 8. The control portion defines an amount of delay $\Delta t$ by the delay circuit 11 based on, for example, a feedback signal output from the amplifier such that less distortion can remain after distortion compensation.

The signal Spd'(t) output from the predistorter shown in FIG. 2 can be expressed by:

$$Spd'(t)=S(t)+O3*S'(t-\Delta t)^3+O5*S'(t-\Delta t)^5+\ldots$$

$$S'(t-\Delta t)^n=|S(t-\Delta t)|^{n-1}S(t-\Delta t)$$

$$(n=3,5,\ldots) \quad [EQ3]$$

This means that the predistorter control signals from the complex multipliers 4 and 7 are delayed by $\Delta t$ for an input signal.

Furthermore, as another construction example, a predistorter can be provided which includes delay circuits in both of the position of the delay circuit 1 shown in FIG. 1 and the position of the delay circuit 11 shown in FIG. 2. Under this construction, a control portion adaptively defines a delay deviation $\Delta\tau$, for example. Here, the delay deviation $\Delta\tau$ is an amount of delay that intentionally gives a difference to the two delay circuits. For example, when $\Delta\tau=0$, an input signal has the same timing as those of the predistorter control signals from the complex multipliers 4 and 7 in the predistorter.

As described above, in the predistorter of this embodiment, processing by a predistortion technique is performed on an input signal at a time t by using envelope information of an input signal at a time $(t+\Delta\tau)$ when a small amount of time delay or small amount of time advance $\Delta\tau$ is given thereto. More specifically, the predistorter of this embodiment includes detectors 2 and 5, multipliers 3 and 6, complex multipliers 4 and 7, delay circuits (including delay circuit 1 and/or delay circuit 11) and an adder 8. The detectors 2 and 5 raise complex input signal to even power. The multipliers 3 and 6 multiply an input signal by the output raised to even power. The complex multipliers 4 and 7 complex-multiply the output from the multipliers 3 and 6 by a distortion compensation coefficient Op. The delay circuit or delay circuits delays or delay one or both of an input signal and a predistorter control signal. The adder 8 adds a delayed input signal and a predistorter control signal.

Therefore, in the predistorter of this embodiment, an input signal and the completed odd-order predistortion signal (that is, predistorter control signal) are differentiated in time and output so that, when a distortion is compensated by a predistortion technique, the distortion due to the AM-AM characteristic and/or AM-PM characteristic can be compensated, and a distortion caused by an influence due to the memory effect of the amplifier can be compensated better than conventional cases, for example. Thus, adjacent channel leak power and/or spurious output can be reduced, and the power efficiency can be increased.

For example, while, in a conventional predistorter, synthesizing a distortion estimated from an input signal to an input signal at a same time, this embodiment clarified in a mathematic simulation regarding digital predistortion (DPD) that a distortion can be further reduced by giving a slight time difference therebetween rather than the synthesis at a same time. Since, a conventional analog apparatus is stabilized with high precision such that no time difference exists between a distortion occurring path (such as the path including the power detecting portion 81 and distortion compensation table 82 shown in FIG. 13) and the main path, the relationship between a delay as in this embodiment and compensation for the memory effect have not been found.

In the predistorter of this example, a delay time difference adjusting unit is provided by one or both of the functions of the delay circuit 1 and delay circuit 11. A predistortion distortion signal giving unit is provided by the function of the adder 8 that adds a signal to be amplified and a predistortion distortion signal.

Second Embodiment

A second embodiment of the invention will be described.

Figure 3:
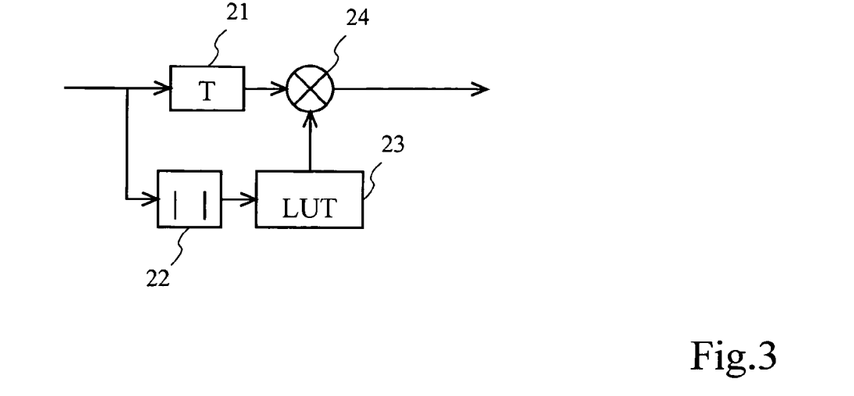
FIG. 3 is a diagram showing a construction example of a predistorter according to a second embodiment of the invention.

FIG. 3 shows a construction example of a predistorter of this embodiment.

As shown in FIG. 3, the predistorter of this embodiment includes a delay circuit 21, an envelope detector circuit 22, a distortion compensation table 23 including a Look Up Table (LUT) using a memory and a complex multiplier 24.

An example of an operation to be performed by the predistorter of this embodiment will be described.

Input signals are I, Q digital base band signals with complex vectors and are input to the delay circuit 21 and the envelope detector circuit 22.

The envelope detector circuit 22 detects a voltage or power value of an envelope of an input signal and outputs the detected value to the distortion compensation table 23. The detected value corresponds to an instant voltage or power value. The distortion compensation table 23 reads a stored distortion compensation coefficient by using the detected value input from the envelope detector circuit 22 as a reference argument and outputs the distortion compensation coefficient to the complex multiplier 24.

The delay circuit 21 delays an input signal by a predetermined time and outputs the result to the complex multiplier 24. The complex multiplier 24 complex-multiplies the input signal delayed by the delay circuit 21 by the distortion compensation coefficient input from the distortion compensation table 23 and gives and outputs the inverse characteristics of an AM-AM characteristic and AM-PM characteristic. The control portion defines an amount of delay by the delay circuit 21 based on, for example, a feedback signal output from the amplifier such that less distortion can remain after distortion compensation.

Figure 4:
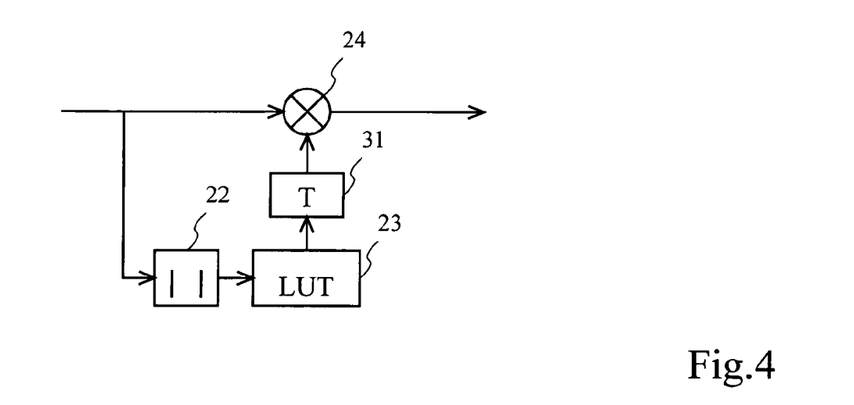
FIG. 4 is a diagram showing another construction example of the predistorter according to the second embodiment of the invention.

FIG. 4 shows another construction example of the predistorter of this embodiment.

The construction of the predistorter shown in FIG. 4 differs from the construction of the predistorter shown in FIG. 3 in that, instead of the delay circuit 21 shown in FIG. 3, a delay circuit 31 having the same function as that of the delay circuit 21 shown in FIG. 3 is provided between the distortion compensation table 23 and the complex multiplier 24. In this embodiment, the same reference numerals are given to the same components as those shown in FIG. 3.

That is, both of the case in which the time waveform of the output from an amplifier is shifted in the direction of advancing in time and the case in which the time waveform is shifted in the direction of delaying in time may be considered as influences due to the memory effect. Therefore, the construction shown in FIG. 3 and the construction shown in FIG. 4 address the two respective cases.

More specifically, in the predistorter shown in FIG. 4, a signal input to the predistorter is input to the complex multiplier 24 without delay, and signals of distortion compensation coefficients output from the distortion compensation table 23 are delayed by the delay circuit 31 by a predetermined time and are input to the complex multiplier 24. The control portion defines an amount of delay by the delay circuit 31 based on, for example, a feedback signal output from the amplifier such that less distortion can remain after distortion compensation.

Furthermore, as another construction example, a predistorter can be provided which includes delay circuits in both of the position of the delay circuit 21 shown in FIG. 3 and the position of the delay circuit 31 shown in FIG. 4. Under this construction, a control portion adaptively defines a delay deviation $\Delta\tau$, for example. Here, the delay deviation $\Delta\tau$ is an amount of delay that intentionally gives a difference to the two delay circuits. For example, when $\Delta\tau=0$, an input signal has the same timing as those of the distortion compensation coefficient signals from the distortion compensation table 23 in the predistorter.

As described above, in the predistorter of this embodiment, processing by a predistortion technique is performed on an input signal at a time t by using envelope information of an input signal at a time $(t+\Delta\tau)$ when a small amount of time delay or small amount of time advance Δτ is given thereto. More specifically, the predistorter of this embodiment includes an envelope detector circuit 22, a distortion compensation table 23, delay circuits (delay circuit 21 and delay circuit 31) and complex multiplier 24. The envelope detector circuit 22 detects a voltage or power value of the envelope of an input signal. The distortion compensation table 23 stores control values for distortion compensation (distortion compensation coefficients). The delay circuits delay one or both of an input signal and a value output from the distortion compensation table 23. The complex multiplier 24 complex-multiplies an input signal after the delay is performed thereon by a control value from the distortion compensation table 23.

Therefore, in the predistorter of this embodiment, an input signal and a distortion compensation coefficient for controlling a form of predistortion are differentiated in time, complex-multiplied and output so that, when a distortion is compensated by a predistortion technique, the distortion due to the AM-AM characteristic and/or AM-PM characteristic can be compensated, and a distortion caused by an influence due to the memory effect of the amplifier can be compensated better than conventional cases, for example. Thus, adjacent channel leak power and/or spurious output can be reduced, and the power efficiency can be increased.

In the predistorter in this embodiment, a predistortion control signal output unit is provided by the function in which the envelope detector circuit 22 and distortion compensation table 23 output a predistortion control signal having a value corresponding to the level of a signal to be amplified, and a delay time difference adjusting unit is provided by one or both of the functions of the delay circuit 21 and delay circuit 31. Furthermore, in the predistorter, a predistortion control signal computing unit is provided by the function of the complex multiplier 24 for complex-multiplying a signal to be amplified by a predistortion control signal.

Third Embodiment

A third embodiment of the invention will be described.

Figure 5:
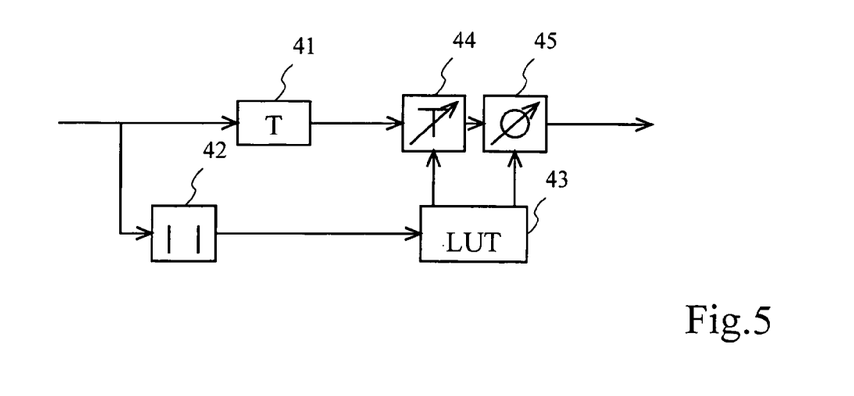
FIG. 5 is a diagram showing a construction example of a predistorter according to a third embodiment of the invention.

FIG. 5 shows a construction example of a predistorter of this embodiment.

As shown in FIG. 5, the predistorter of this embodiment includes a delay circuit 41, an envelope detector circuit 42, a distortion compensation table 43 including a Look Up Table (LUT) using a memory, a voltage adjustable attenuator 44 and a voltage adjustable phase shifter 45.

An example of an operation to be performed by the predistorter of this embodiment will be described.

In this embodiment, analog predistortion is performed.

Input signals are radio frequency (RF) signals and are input to the delay circuit 41 and the envelope detector circuit 42.

The envelope detector circuit 42 detects a voltage or power value of an envelope of an input signal and outputs the detected value to the distortion compensation table 43. The detected value corresponds to an instant voltage or power value. The distortion compensation table 43 reads an amplitude control value and phase control value, which are stored distortion compensation coefficients, by using the detected value input from the envelope detector circuit 42 as a reference argument and outputs the amplitude control value to the voltage adjustable attenuator 44 and the phase control value to the voltage adjustable phase shifter 45.

The delay circuit 41 delays an input signal by a predetermined time and outputs the result to the voltage adjustable attenuator 44. The voltage adjustable attenuator 44 attenuates a signal input from the delay circuit 41 with an amount of attenuation controlled by the amplitude control value input from the distortion compensation table 43, gives the inverse characteristic of an AM-AM characteristic thereto and outputs the result to the voltage adjustable phase shifter 45. The voltage adjustable phase shifter 45 changes the phase of a signal input from the voltage adjustable attenuator 44 with an amount of change in phase controlled by the phase control value input from the distortion compensation table 43 and gives and outputs the inverse characteristic of an AM-PM characteristic thereto. The control portion defines an amount of delay by the delay circuit 41 based on, for example, a feedback signal output from the amplifier such that less distortion can remain after distortion compensation.

Figure 6:
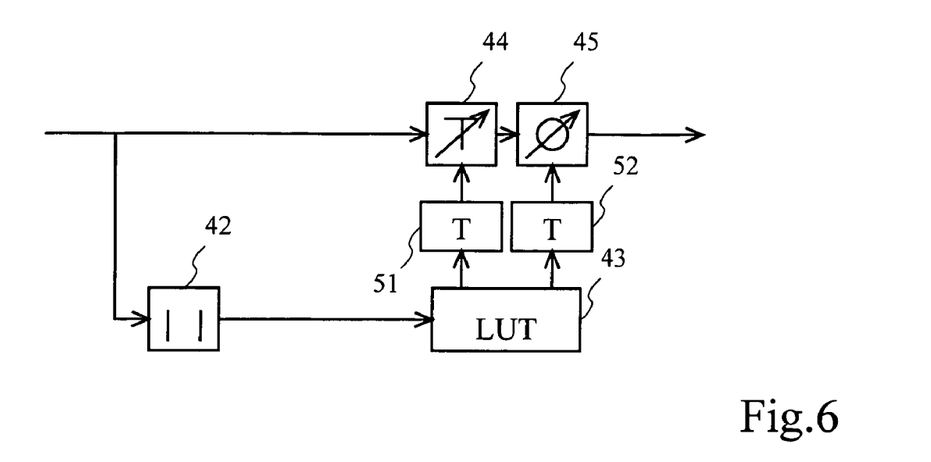
FIG. 6 is a diagram showing another construction example of the predistorter according to the third embodiment of the invention.

FIG. 6 shows another construction example of the predistorter of this embodiment.

The construction of the predistorter shown in FIG. 6 differs from the construction of the predistorter shown in FIG. 5 in that, instead of the delay circuit 41 shown in FIG. 5, two delay circuits 51 and 52 having the same function as that of the delay circuit 41 shown in FIG. 5 are provided between the distortion compensation table 43 and the voltage adjustable attenuator 44 and between the distortion compensation table 43 and the voltage adjustable phase shifter 45. In this embodiment, the same reference numerals are given to the same components as those shown in FIG. 5.

That is, both of the case in which the time waveform of the output from an amplifier is shifted in the direction of advancing in time and the case in which the time waveform is shifted in the direction of delaying in time may be considered as influences due to the memory effect. Therefore, the construction shown in FIG. 5 and the construction shown in FIG. 6 address the two respective cases.

More specifically, in the predistorter shown in FIG. 6, a signal input to the predistorter is input to the voltage adjustable attenuator 44 without delay. Then, the signal of the amplitude control value output from the distortion compensation table 43 is delayed by the delay circuit 51 by a predetermined time and is input to the voltage adjustable attenuator 44, and the signal of the phase control value output from the distortion compensation table 43 is delayed by the delay circuit 52 by a predetermined time and is input to the voltage adjustable phase shifter 45. The control portion defines amounts of delay by the delay circuits 51 and 52 based on, for example, a feedback signal output from the amplifier such that less distortion can remain after distortion compensation.

Furthermore, as another construction example, a predistorter can be provided which includes delay circuits in all of the position of the delay circuit 41 shown in FIG. 5 and the positions of the delay circuits 51 and 52 shown in FIG. 6. Under this construction, a control portion adaptively defines a delay deviation Δτ, for example. Here, the delay deviation Δτ is an amount of delay that intentionally gives a difference to the two delay circuits (one of which is the delay circuit 41 and the other of which includes the two delay circuits 51 and 52 in this embodiment). For example, when Δτ=0, an input signal has the same timing as those of the distortion compensation coefficient signals (which are an amplitude control value signal and a phase control value signal) from the distortion compensation table 43 in the predistorter.

As described above, in the predistorter of this embodiment, processing by a predistortion technique is performed on an input signal at a time t by using envelope information of an input signal at a time (t+Δτ) when a small amount of time delay or small amount of time advance Δτ is given thereto. More specifically, the predistorter of this embodiment includes an envelope detector circuit 42, a distortion compensation table 43, delay circuits (delay circuit 41 and/or delay circuits 51 and 52), a voltage adjustable attenuator 44 and a voltage adjustable phase shifter 45. The envelope detector circuit 42 detects a voltage or power value of an envelope of an input signal. The distortion compensation table 43 stores control values for distortion compensation. The delay circuits delay one or both of an input signal and a value output from the distortion compensation table 43. The voltage adjustable attenuator 44 can change an amount of attenuation of an input signal in accordance with a control value from the distortion compensation table 43. The voltage adjustable phase shifter 45 can change the phase of an input signal in accordance with a control value from the distortion compensation table 43.

Therefore, in the predistorter of this embodiment, an input signal and distortion compensation coefficients (including an amplitude control value and a phase control value) for controlling a form of predistortion are differentiated in time, controlled in amplitude and controlled in phase and output so that, when a distortion is compensated by a predistortion technique, the distortion due to the AM-AM characteristic and/or AM-PM characteristic can be compensated, and a distortion caused by an influence due to the memory effect of the amplifier can be compensated better than conventional cases, for example. Thus, adjacent channel leak power and/or spurious output can be reduced, and the power efficiency can be increased.

In the predistorter in this embodiment, a predistortion distortion generation control signal output unit is provided by the function in which the envelope detector circuit 42 and distortion compensation table 43 output a control signal relating to an amplitude distortion and control signal relating to a phase distortion as predistortion distortion generation control signals each having a value corresponding to a level of a signal to be amplified, and a delay time difference adjusting unit is provided by one or both of the functions of the delay circuit 41 and two delay circuits 51 and 52. Furthermore, in the predistorter, a predistortion distortion generating unit is provided by the function in which the voltage adjustable attenuator 44 gives an amplitude distortion based on a control signal relating to the amplitude distortion to a signal to be adjusted and the voltage adjustable phase shifter 45 gives a phase distortion based on a control signal relating to the phase distortion thereto.

Fourth Embodiment

A fourth embodiment of the invention will be described.

Figure 7:
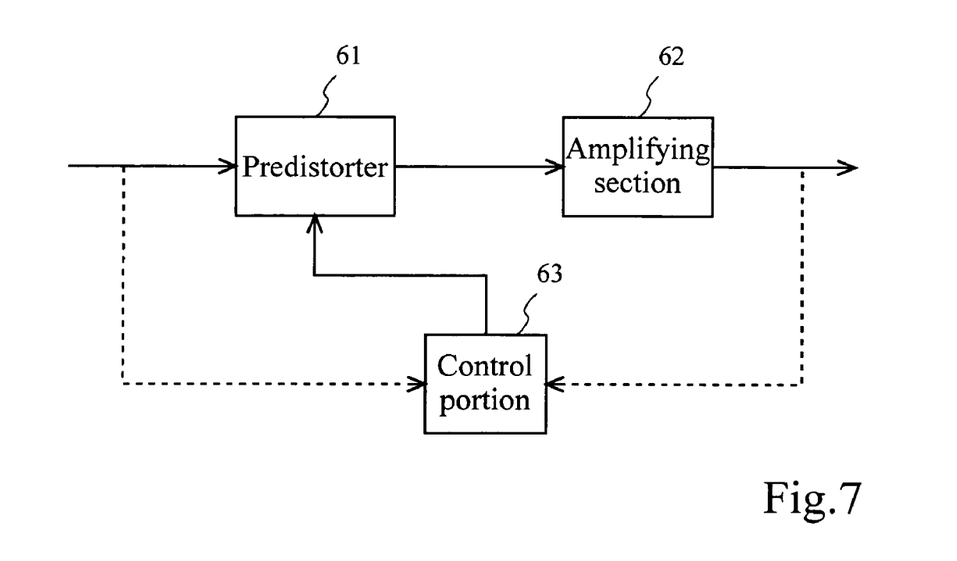
FIG. 7 is a diagram showing a construction example of distortion-compensated amplifier using predistortion technique according to a fourth embodiment.

FIG. 7 shows a construction example of an amplifier having a function of compensating for a distortion by a predistortion technique (distortion-compensated amplifier using predistortion technique).

As shown in FIG. 7, a distortion-compensated amplifier using predistortion technique in this embodiment includes a predistorter 61, an amplifying section 62 and a control portion 63.

An example of an operation to be performed by a distortion-compensated amplifier using predistortion technique in this embodiment will be described.

An input signal is input to the predistorter 61 and the control portion 63.

The predistorter 61 is a predistorter based on instant power and includes processing portions such as a power detecting portion and a distortion compensation table if required. The predistorter 61 gives a distortion for predistortion (that is, a predistortion) to an input signal and outputs the distorted input signal to the amplifying section 62.

More specifically, as the predistorter 61, one of the predistorters shown in FIGS. 1 to 6 is used, that is, a predistorter having a predetermined delay circuit delaying one or both of an input signal and a predistortion signal is used. The predistorter based on instant power is used for compensating for an AM-AM characteristic and/or AM-PM characteristic that an amplifier has but cannot compensate for the memory effect. Accordingly, a predetermined delay circuit is provided in the predistorter like this embodiment so that the output waveforms from the predistorter can be brought close into a waveform without the memory effect, which means that the memory effect can be compensated thereby.

The amplifying section 62 includes an amplifier having nonlinearity and a memory-effect characteristic to be distortion-compensated and amplifies and outputs a signal input from the predistorter 61. At that time, a distortion given by the predistorter 61 and a distortion caused in the amplifying section 62 cancel each other. In general, when distortion is compensated to −50 dBc to −60 dBc or below by using the predistorter 61, the compensation is influenced by the memory effect. Furthermore, a part of the signal output from the amplifying section 62 is input to the control portion 63.

The control portion 63 performs processing for setting or adapting a distortion compensation table and/or distortion compensation coefficients of the predistorter 61, for example.

The invention can be applied to predistortion techniques for a base band (BB), intermediate frequency (IF) band, or radio frequency (RF) band as a frequency band. The invention may be applied to various kinds of distortion techniques whereby processing may be digitally performed or may be performed in analog form.

A digital-to-analog (D/A) converter, orthogonal modulator (or orthogonal modulating portion), up-converter, filter and so on may be used as required in accordance with a type of a used predistortion technique. The presence of a feedback signal to be used in order to adapt to an environmental change is not especially limited. Furthermore, in order to use such a feedback signal, a down-converter, an oscillator, a filter, an orthogonal demodulator (or orthogonal demodulating portion), an analog-to-digital (A/D) converter and so on may be provided in the predistorter. In addition, in order to detect distortion, an input signal may be used.

Figure 8:
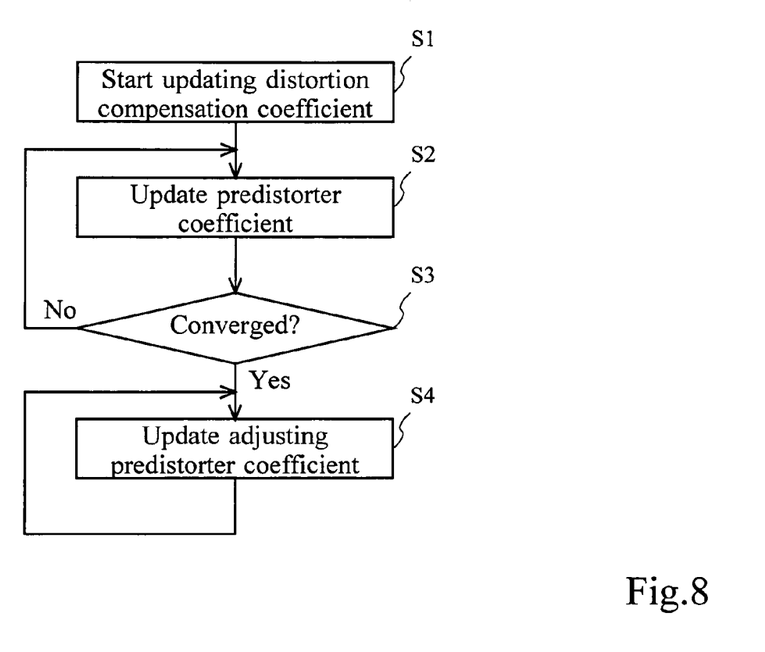
FIG. 8 is a diagram showing an example of steps of processing of updating a distortion compensating coefficient to be performed by a distortion-compensated amplifier using predistortion technique.

Next, an example of processing steps of an algorithm for updating and converging distortion compensation coefficients by using a distortion-compensated amplifier using predistortion technique of this embodiment will be described with reference to FIG. 8.

In other words, in the distortion-compensated amplifier using predistortion technique of this embodiment, once a process for updating distortion compensation coefficients starts (step S1), distortion compensation coefficients relating to the predistorter 61 are updated (step S2). Then, whether the distortion compensation coefficients have been converged or not is determined (step S3). If not, updating the distortion compensation coefficients is repeated in the same manner (step S2). If so, the converged distortion compensation coefficient is further adaptively updated in accordance with an environmental change (step S4). While the same updating method is adopted before and after the convergence, the step size $\mu$ for updating the distortion compensation coefficients may be changed in accordance with the magnitude of an error.

Thus, in this embodiment, the values (or table) of the distortion compensation coefficients of the predistorter 61 are converged to an optimum value (or optimum table), which can compensate for distortion most. Then, the update process on distortion compensation coefficients (or table) is not ended even after the convergence of the first order and is continued in subsequent steps. Thus, the distortion compensation coefficients are adapted to various kinds of variation such as a temperature variation and an aging variation.

In a method of the convergence, as expressed in EQ1, complex coefficients may be converged for an amplitude and a phase separately. Alternatively, real complex coefficients and imaginary complex coefficients may be converged separately, or two of real complex coefficients and imaginary complex coefficients may be converged together. A table may be converged for each of the table values or may be converged by using a representative points, for example, or may be converged by collectively creating table values by, for example, a spline technique.

Figure 9:
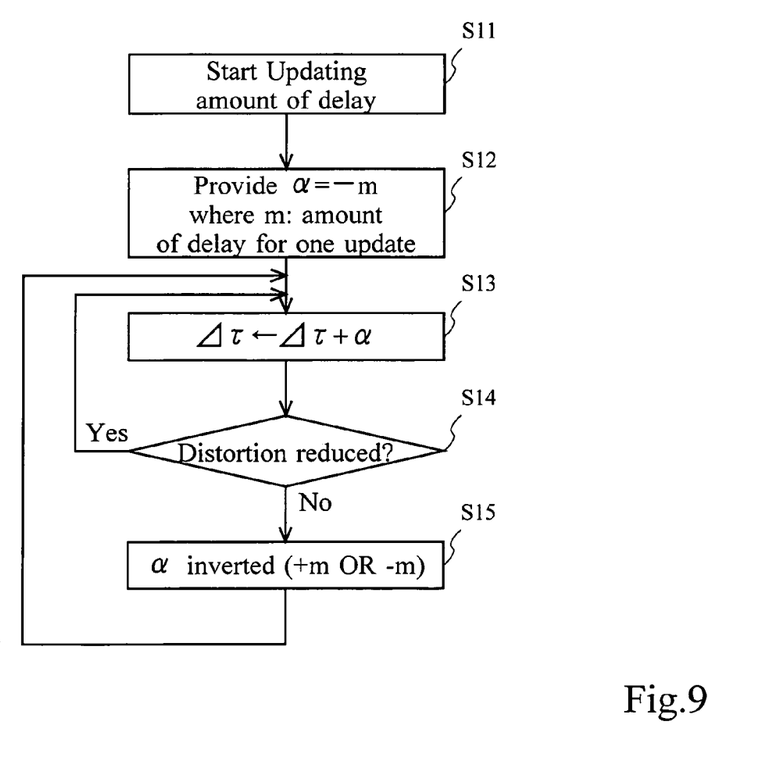
FIG. 9 is a diagram showing an example of steps of processing of determining an optimum delay amount to be performed by a distortion-compensated amplifier using predistortion technique.

Next, with reference to FIG. 9, an example of processing steps will be described in which the control portion 63 sets an amount of delay time of a delay circuit included in the predistorter 61 in an optimum manner in a distortion-compensated amplifier using predistortion technique of this embodiment.

While the predistorter shown in FIG. 1 is used as the predistorter 61 in this embodiment, the same is true in cases using constructions having other predistorters.

That is, in the distortion-compensated amplifier using the predistortion technique of this embodiment, once updating an amount of delay to be set in the delay circuit 1 included in the predistorter 61 starts (step S11), the control portion 63 sets an amount of delay m for one update as an initial value and provides α=−m (step S12). The amount of delay of the delay circuit 1 is updated by adding α to the delay deviation Δτ (step S13), and whether the amount of distortion remaining after distortion compensation is reduced by the update or not is determined (step S14). If the amount of distortion remaining after distortion compensation is reduced by the update as a result of the determination, the control portion 63 further continues the same update (step S13). On the other hand, if the amount of distortion remaining after distortion compensation is increased by the update, the plus/minus (±) sign of α is inverted (step S15). Then, the same update is continued (step S13).

Here, the initial value of the amount of delay is desirably near the center of an adjustable range thereof, and, desirably, the delay deviation Δτ=0. Further detail adjustment can be performed by decreasing the value of m when the amount of almost suitable delay is obtained. As a result, the time until the optimum value can be obtained is reduced. Even after that, by continuing the algorithm by using m, which is a small value, m can be adaptively follow the optimum value depending on an environmental change if any, for example. While, the value of the amount of delay m for one update is preferably changed to a small value as the update proceeds but may be set as a fixed value.

As described above, in the distortion-compensated amplifier by using the predistortion technique of this embodiment, one predistorter as shown in FIGS. 1 to 6 is provided as the predistorter 61. Furthermore, the control portion 63 that adaptively controls a control value of the predistorter 61 and the amplifying section 62 that amplifies an input signal to be distortion-compensated are provided therein.

Therefore, in the distortion-compensating apparatus using the predistortion technique of this embodiment, when a distortion is compensated for the amplifying section 62, a distortion due to an AM-AM characteristic and/or AM-PM characteristic can be compensated by the predistorter 61, and a distortion caused by an influence due to the memory effect of the amplifying section 62 can be compensated by the predistorter 61 better than conventional cases, for example. Thus, adjacent channel leak power and/or spurious output can be reduced, and the power efficiency can be increased.

Next, specific examples of the advantages of the use of the predistorter 61 of this embodiment will be described.

Figure 10:
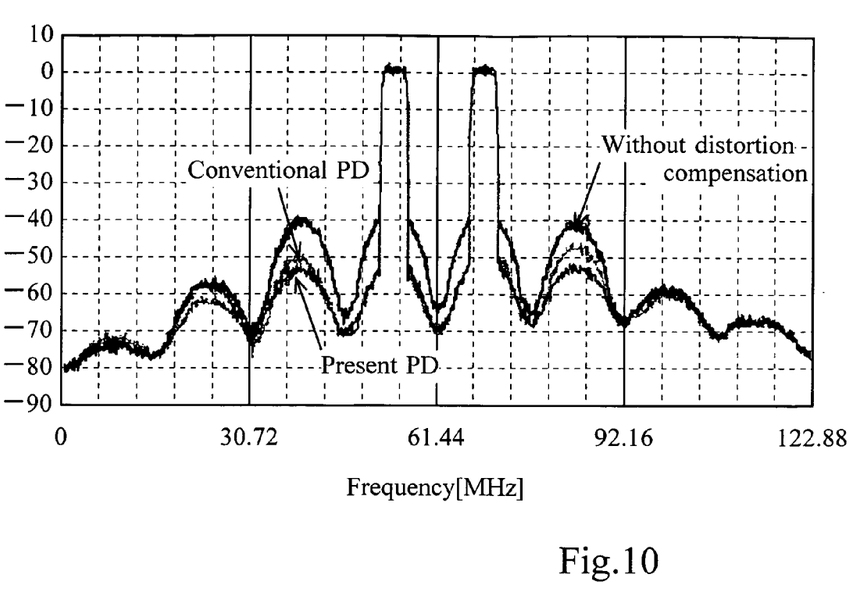
FIG. 10 is a diagram showing an example of a result of a simulation in a case where an amplifying section has an AM-AM characteristic, AM-PM characteristic and memory effect characteristic.

FIG. 10 shows an example of a result of a simulation relating to, in a case where the amplifying section 62 has an AM-AM characteristic, an AM-PM characteristic and a memory effect characteristic, a signal amplified when distortion compensation is not performed ("without distortion compensation"), a signal amplified when the AM-AM characteristic and AM-PM characteristic are only compensated ("conventional PD") and a signal amplified when the AM-AM characteristic, AM-PM characteristic and memory effect characteristic are compensated as in this embodiment ("present PD"). The horizontal axis indicates frequencies [MHz] while the vertical axis indicates signal levels. This example shows a case where intermediate frequency (IF) signals in two carriers in W-CDMA system are used.

As shown in FIG. 10, an environment having a time shift occurs between instant power detected by the envelope detector circuit and a waveform influenced by the memory effect in the predistorter without delay ("conventional PD"), and third-order intermodulation distortion on the low frequency side (IM3 Lower) and third-order intermodulation distortion on the high frequency side (IM3 Upper) are only improved by about 10 dB and about 7 dB, respectively. On the other hand, a delay circuit is provided in the predistorter 61 of this embodiment ("present PD") so that the influence from the memory effect can be suppressed and third-order intermodulation distortion on the low frequency side (IM3 Lower) and third-order intermodulation distortion on the high frequency side (IM3 Upper) can be improved by about 13 dB and about 13 dB, respectively. Thus, in the predistorter 61 of this embodiment, an amount of distortion compensation for an amplifier influenced by the memory effect can be more improved than those of conventional cases.

Here, while, in FIG. 10, the band width including up to the fifth order distortion takes a little less than 100 MHz, one sample time is 4 nsec in the simulation shown in FIGS. 12A and 12B, which assume a high-speed sample making double or more allowance therefor.

Furthermore, in order to increase the precision for compensating for the memory effect, the unit of the adjustment of delay time must be lower than 4 nsec. For example, an interpolation technique such as Nyquist interpolation is used to process digital signals so that delay time can be slightly adjusted by an amount equal to or lower than the sample time.

Here, Nyquist interpolation will be described.

For example, in an interpolation circuit, a Nyquist interpolation technique may be used to carry out an operation as expressed by:

$$DL(\tau, n) = \sum_{m=-L}^{m=L} R(n-m)\sin(\tau - m\pi)/(\tau - m\pi) \quad \text{[EQ 4]}$$

where a signal series to be input to the interpolation circuit is R(n) (n=−∞, . . . , −1, 0, 1, 2, 3, 4, . . . ) and an output from the interpolation circuit determined by an amount of delay τ is DL (τ,n). Thus, a delay can be given to the input signal series R(n).

Furthermore, for example, multiple interpolation circuits having different amounts of delay may be provided so that the best one of delay signals obtained from these multiple interpolation circuits can be selected. For example, when three interpolation circuits are provided, a signal DL (x, n) output from a first interpolation circuit, a signal DL (x+Δx,n) output from a second interpolation circuit, and a signal DL (x−Δx,n) output from a third interpolation circuit can be expressed by $$DL(x, n) = \sum_{m=-L}^{m=L} R(n-m)\sin(x - m\pi)/(x - m\pi) \quad [EQ\ 5]$$

$$DL(x+\Delta x, n) = \sum_{m=-L}^{m=L} R(n-m)\sin(x + \Delta x - m\pi)/(x + \Delta x - m\pi) \quad [EQ\ 6]$$

$$DL(x-\Delta x, n) = \sum_{m=-L}^{m=L} R(n-m)\sin(x - \Delta x - m\pi)/(x - \Delta x - m\pi) \quad [EQ\ 7]$$

where an amount of delay τ in the first interpolation circuit is equal to x, an amount of delay τ in the second interpolation circuit is equal to (x+Δx) and an amount of delay τ in the third interpolation circuit is equal to (x−Δx), and L is an integer equal to or larger than 4.

Here, the constructions of the predistorter and distortion-compensated amplifier using predistortion technique according to the invention are not always limited to those described above, but various constructions may be adopted instead. The invention can be provided as a method or technique for implementing processing according to the invention, a program of implementing the method or technique and/or a storage medium storing the program. Furthermore, the invention can be further provided as various apparatus and/or systems.

The field of the application of the invention is not always limited to the above-described field, but the invention can be applied to various fields.

In different kinds of processing to be performed in the predistorter and/or distortion-compensated amplifier using the predistortion technique according to the invention, a processor in a hardware resource including processors, memories and so on may execute a control program stored in a read-only memory (ROM) to control different kinds of processing to be performed by a predistorter or distortion-compensated amplifier using the predistortion technique according to the invention. Moreover, each function unit for implementing the processing may be an independent hardware circuit.

The invention can be identified as a computer-readable storage medium such as a Floppy (registered trademark) disk and compact disk (CD)-ROM storing the control program or as the program (itself). The processing according to the invention can be implemented by inputting the control program from the storage medium to a computer and causing a processor to execute the control program.

What is claimed is:

1. A predistorter, for use with an amplifier, for compensating for distortion occurring in the amplifier in amplifying a signal to be amplified, said predistorter comprising:

means for generating a predistortion distortion signal based on the signal to be amplified;

means for adjusting a delay time difference between the signal to be amplified and the predistortion distortion signal so as to reduce an influence by a memory effect occurring in the amplifier, wherein said means for adjusting the delay time difference adjusts the delay time difference in increments smaller than approximately double a band width of the predistortion distortion signal; and means for performing processing on the signal to be amplified based on the predistortion distortion signal so as to adjust the delay time difference.

2. A predistorter, for use with an amplifier, for compensating for distortion occurring in the amplifier in amplifying a signal to be amplified, said predistorter comprising:

means for generating a predistortion distortion signal based on the signal to be amplified;

means for adjusting a delay time difference between the signal to be amplified and the predistortion distortion signal so as to reduce an influence by a memory effect occurring in the amplifier; and means for performing processing on the signal to be amplified based on the predistortion distortion signal so as to adjust the delay time difference;

wherein said means for adjusting the delay time difference adjusts the delay time difference by defining an update value and adding the update value to the delay time difference, leaves a plus/minus sign of the update value as it is when the adding of the update value to the delay time difference decreases an amount of distortion remaining after processing by said means for performing processing, and inverts the plus/minus sign of the update value when the adding of the update value to the delay time difference increases the amount of distortion remaining after processing by said means for performing processing.

3. A predistorter, for use with an amplifier, for compensating for distortion occurring in the amplifier in amplifying a signal to be amplified, said predistorter comprising:

predistortion distortion signal generating means for generating a predistortion distortion signal, including an odd-order signal component, based on the signal to be amplified;

delay time difference adjusting means for adjusting a delay time difference between the signal to be amplified and the predistortion distortion signal so as to reduce distortion by a memory effect occurring in the amplifier; and predistortion distortion signal providing means for combining the signal to be amplified and the predistortion signal so as to adjust the delay time difference;

wherein said predistortion distortion signal generating means comprises: a detector that detects an even-power-raised value of the signal to be amplified; a multiplier that multiplies a detection result of the detector by the signal to be amplified; and a complex-multiplier that complex multiplies a multiplication result of the multiplier by a distortion compensation coefficient;

wherein said delay time difference adjusting means comprises a delay circuit that delays the signal to be amplified; and wherein the predistortion distortion signal providing means comprises an adder that adds an output of the delay circuit and an output of the predistortion distortion signal generating means.

4. A predistorter, for use with an amplifier, for compensating for distortion occurring in the amplifier in amplifying a signal to be amplified, said predistorter comprising:

predistortion distortion signal generating means for generating a predistortion distortion signal, including an odd-order signal component, based on the signal to be amplified;

delay time difference adjusting means for adjusting a delay time difference between the signal to be amplified and the predistortion distortion signal so as to reduce distortion by a memory effect occurring in the amplifier; and predistortion distortion signal providing means for combining the signal to be amplified and the predistortion signal so as to adjust the delay time difference;

wherein said predistortion distortion signal generating means comprises: a detector that detects an even-power-raised absolute value of the signal to be amplified; a multiplier that multiplies a detection result of the detector by the signal to be amplified; and a complex-multiplier that complex multiplies a multiplication result of the multiplier by a distortion compensation coefficient;

wherein said delay time difference adjusting means comprises a delay circuit that delays an output of the predistortion distortion signal generating means; and wherein the predistortion signal providing means comprises an adder that adds an output of the delay circuit and the signal to be amplified.

5. A predistorter, for use with an amplifier, for compensating for distortion occurring in the amplifier in amplifying a signal to be amplified, said predistorter comprising:

predistortion distortion signal generating means for generating a predistortion distortion signal, including an odd-order signal component, based on the signal to be amplified;

delay time difference adjusting means for adjusting a delay time difference between the signal to be amplified and the predistortion distortion signal so as to reduce distortion by a memory effect occurring in the amplifier; and predistortion distortion signal providing means for combining the signal to be amplified and the predistortion signal so as to adjust the delay time difference;

wherein the predistortion signal generating means comprises a first signal path and a second signal path;

wherein the first signal path includes a square-law detector that detects a square absolute value of the signal to be amplified, a first multiplier that multiplies a detection result of the square-law detector by the signal to be amplified, and a first complex-multiplier that complex-multiplies a multiplication result of the first multiplier by a first distortion compensation coefficient;

wherein the second signal path includes a fourth-power-law detector that detects a fourth-power-raised absolute value of the signal to be amplified, a second multiplier that multiplies a detection result of the fourth-power-law detector by the signal to be amplified, and a second complex-multiplier that complex-multiplies a multiplication result of the second multiplier by a second distortion compensation coefficient;

wherein the delay time difference adjusting means comprises a delay circuit that delays a signal output from the first signal path and a signal output from the second signal path; and wherein the predistortion signal providing means comprises an adder that adds the signals delayed by the delay circuit and the signal to be amplified.

* * * * *